United States Patent
Arellano

(10) Patent No.: US 11,862,579 B2
(45) Date of Patent: Jan. 2, 2024

(54) SEMICONDUCTOR DEVICE HAVING CAVITIES AT AN INTERFACE OF AN ENCAPSULANT AND A DIE PAD OR LEADS

(71) Applicant: STMICROELECTRONICS, INC., Calamba (PH)

(72) Inventor: Ian Harvey Arellano, Bauang (PH)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 17/845,867

(22) Filed: Jun. 21, 2022

(65) Prior Publication Data
US 2022/0320014 A1    Oct. 6, 2022

Related U.S. Application Data

(62) Division of application No. 16/996,712, filed on Aug. 18, 2020, now Pat. No. 11,393,774.
(Continued)

(51) Int. Cl.
*H01L 23/495*      (2006.01)
*H01L 23/00*       (2006.01)
(Continued)

(52) U.S. Cl.
CPC ........ *H01L 23/562* (2013.01); *H01L 21/4825* (2013.01); *H01L 21/565* (2013.01);
(Continued)

(58) Field of Classification Search
CPC ............. H01L 23/495; H01L 23/49541; H01L 23/49548; H01L 21/56; H01L 21/565
(Continued)

(56) References Cited

U.S. PATENT DOCUMENTS 4,258,381 A    3/1981   Inaba
4,775,444 A    10/1988   Cordani
(Continued)

FOREIGN PATENT DOCUMENTS

WO    WO 2013083600 A2    6/2013

OTHER PUBLICATIONS

Aldakov et al., "Selective Electroless Copper Deposition on Self-Assembled Dithiol Monolayers," *Applied Materials & Interfaces* 1(3):584-589, 2009.
(Continued)

*Primary Examiner* — Nitin Parekh
(74) *Attorney, Agent, or Firm* — Seed IP Law Group LLP

(57) ABSTRACT

In various embodiments, the present disclosure provides semiconductor devices, packages, and methods. In one embodiment, a device includes a die pad, a lead that is spaced apart from the die pad, and an encapsulant on the die pad and the lead. A plurality of cavities extends into at least one of the die pad or the lead to a depth from a surface of the at least one of the die pad or the lead. The depth is within a range from 0.5 μm to 5 μm. The encapsulant extends into the plurality of cavities. The cavities facilitate improved adhesion between the die pad or lead and the encapsulant, as the cavities increase a surface area of contact with the encapsulant, and further increase a mechanical interlock with the encapsulant, as the cavities may have a rounded or semi-spherical shape.

20 Claims, 5 Drawing Sheets

Related U.S. Application Data

(60) Provisional application No. 62/889,841, filed on Aug. 21, 2019.

(51) Int. Cl.
 *H01L 23/31* (2006.01)
 *H01L 21/56* (2006.01)
 *H01L 21/48* (2006.01)

(52) U.S. Cl.
 CPC ...... *H01L 23/3114* (2013.01); *H01L 23/4952* (2013.01); *H01L 23/49513* (2013.01); *H01L 23/49548* (2013.01); *H01L 23/49582* (2013.01)

(58) Field of Classification Search
 USPC .......................................................... 257/669
 See application file for complete search history.

(56) References Cited

U.S. PATENT DOCUMENTS

| | | | |
|---|---|---|---|
| 4,862,246 A | 8/1989 | Masuda et al. | |
| 4,918,511 A | 4/1990 | Brown | |
| 5,021,865 A | 6/1991 | Takahashi et al. | |
| 5,162,894 A | 11/1992 | Asano et al. | |
| 5,712,507 A | 1/1998 | Eguchi et al. | |
| 6,372,027 B1 | 4/2002 | Tomaiuolo et al. | |
| 6,548,328 B1 * | 4/2003 | Sakamoto | H01L 24/97 438/123 |
| 7,087,462 B1 | 8/2006 | Park et al. | |
| 7,968,998 B1 * | 6/2011 | Choi | H01L 23/49541 257/676 |
| 7,989,933 B1 * | 8/2011 | Kim | H01L 23/49541 257/676 |
| 8,067,271 B2 * | 11/2011 | Do | H01L 23/49541 257/670 |
| 8,410,585 B2 * | 4/2013 | Ahn | H01L 23/495 257/676 |
| 10,105,875 B2 | 10/2018 | Young et al. | |
| 10,115,876 B2 * | 10/2018 | Yamashita | H01L 23/49541 |
| 10,201,917 B2 * | 2/2019 | Kaneko | H01L 23/50 |
| 10,790,258 B2 * | 9/2020 | Matsubara | H01L 23/564 |
| 2004/0080025 A1 | 4/2004 | Kasahara et al. | |
| 2010/0084756 A1 | 4/2010 | Dirks et al. | |
| 2015/0357269 A1 | 12/2015 | Im | |
| 2016/0111357 A1 | 4/2016 | Uchida et al. | |
| 2016/0118365 A1 * | 4/2016 | Singh | H01L 24/33 257/676 |
| 2019/0198454 A1 | 6/2019 | Talledo | |
| 2019/0371710 A1 | 12/2019 | Urushihata et al. | |

OTHER PUBLICATIONS

Yamamoto et al., "An Electroless Plating Method for Conducting Microbeads Using Gold Nanoparticles," *Journal of the Electrochemical Society I* 54(9):D462-D466, 2007.

* cited by examiner

SEMICONDUCTOR DEVICE HAVING CAVITIES AT AN INTERFACE OF AN ENCAPSULANT AND A DIE PAD OR LEADS

BACKGROUND

Technical Field

Embodiments of the present disclosure are generally directed to semiconductor devices, packages, and methods in which an interface is formed between an encapsulant and a die pad or leads.

Description of the Related Art

Semiconductor packages generally include one or more semiconductor electronic components, such as a semiconductor die including one or more integrated circuits (ICs), and a casing to protect the semiconductor die and other internal electronic components. Semiconductor packages come in many forms, including ball grid array (BGA) packages, land grid array (LGA) packages, and quad flat no-lead ("QFN") packages.

QFN packages typically include a lead frame having a back surface of a die pad exposed on a back side of the package. Leads are also exposed on the back side of the package and are spaced apart from and surrounding the die pad. Within the package, the lead frame supports a die in a central position and often includes wire bonds from the die to the leads. A molding compound or sealant is formed over the die, the wires, and the leadframe to complete the package.

The molding compound typically contacts interior surfaces of the die pad and the leads, and the molding compound should generally be adhered to the interior surfaces of the die pad and the leads. Poor adherence between the molding compound and the die pad and the leads can lead to delamination of the molding compound, which can result in failure of the device due to introduction of liquids, moisture, or other contaminants.

BRIEF SUMMARY

In various embodiments, the present disclosure provides semiconductor packages, devices, and methods in which one or more surfaces of a die pad or a lead frame includes a plurality of cavities which improve adhesion between the die pad or lead and an encapsulant material, such as a mold compound or an epoxy mold compound. The cavities may be formed by an immersion porous copper adhesion promoter (IPC-AP) process, in which microstructures are embedded in a deposited copper layer through an electroless copper plating process. The microstructures may be removed, for example, by a solvent, and the cavities are formed due to the removal of the microstructures. The cavities provide a roughened surface for better adhesion and mechanical interlock with the mold compound, which reduces or prevents delamination between the mold compound and the die pad or leads.

In one embodiment, the present disclosure provides a device that includes a die pad, a lead spaced apart from the die pad, and an encapsulant on the die pad and the lead. A plurality of cavities extends into at least one of the die pad or the lead to a depth from a surface of the at least one of the die pad or the lead. The depth is within a range from 0.5 µm to 5 µm, inclusive. The encapsulant extends into the plurality of cavities.

In another embodiment, the present disclosure provides a method of forming a semiconductor device that includes: forming a conductive layer on a conductive substrate, the conductive layer including a plurality of microstructures at least partially embedded in the conductive layer; forming a plurality of cavities in the conductive layer by removing the plurality of microstructures; and at least partially filling the plurality of cavities with an encapsulation material.

In yet another embodiment, the present disclosure provides an electronic device that includes a microprocessor and a semiconductor package electrically coupled to the microprocessor. The semiconductor package includes a die pad, a lead spaced apart from the die pad, and an encapsulant on the die pad and the lead. A plurality of cavities extends into at least one of the die pad or the lead to a depth from a surface of the at least one of the die pad or the lead. The depth is within a range from 0.5 µm to 5 µm, inclusive. The encapsulant extends into the plurality of cavities.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with semiconductor dies, lead frames, and semiconductor packages have not been shown or described in detail to avoid unnecessarily obscuring descriptions of the various embodiments provided herein.

Unless the context requires otherwise, throughout the specification and claims that follow, the word "comprise" and variations thereof, such as "comprises" and "comprising" are to be construed in an open, inclusive sense, that is, as "including, but not limited to." Further, the terms "first," "second," and similar indicators of sequence are to be construed as being interchangeable unless the context clearly dictates otherwise.

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments of the present disclosure.

As used in the specification and the appended claims, the singular forms "a," "an," and "the" include plural referents unless the context clearly dictates otherwise. It should also be noted that the term "or" is generally employed in its broadest sense, that is, as meaning "and/or" unless the context clearly dictates otherwise.

The present disclosure is generally directed to semiconductor devices, packages, and methods of forming semiconductor devices and packages in which one or more surfaces of a substrate are processed to improve adhesion between the substrate and an encapsulant material, such as a mold compound or an epoxy mold compound. An immersion porous copper adhesion promoter (IPC-AP) process is performed on the substrate, which may be a copper substrate or lead frame, and the process utilizes microbeads in an electroless copper plating process. The microbeads become embedded during deposition of a layer of copper on the copper substrate. The microbeads may be soluble, and can be removed by any solvent, thereby leaving behind a roughened surface in the copper layer. The roughened surface promotes better adhesion with the mold compound, which reduces or prevents delamination between the mold compound and the substrate.

Figure 1:
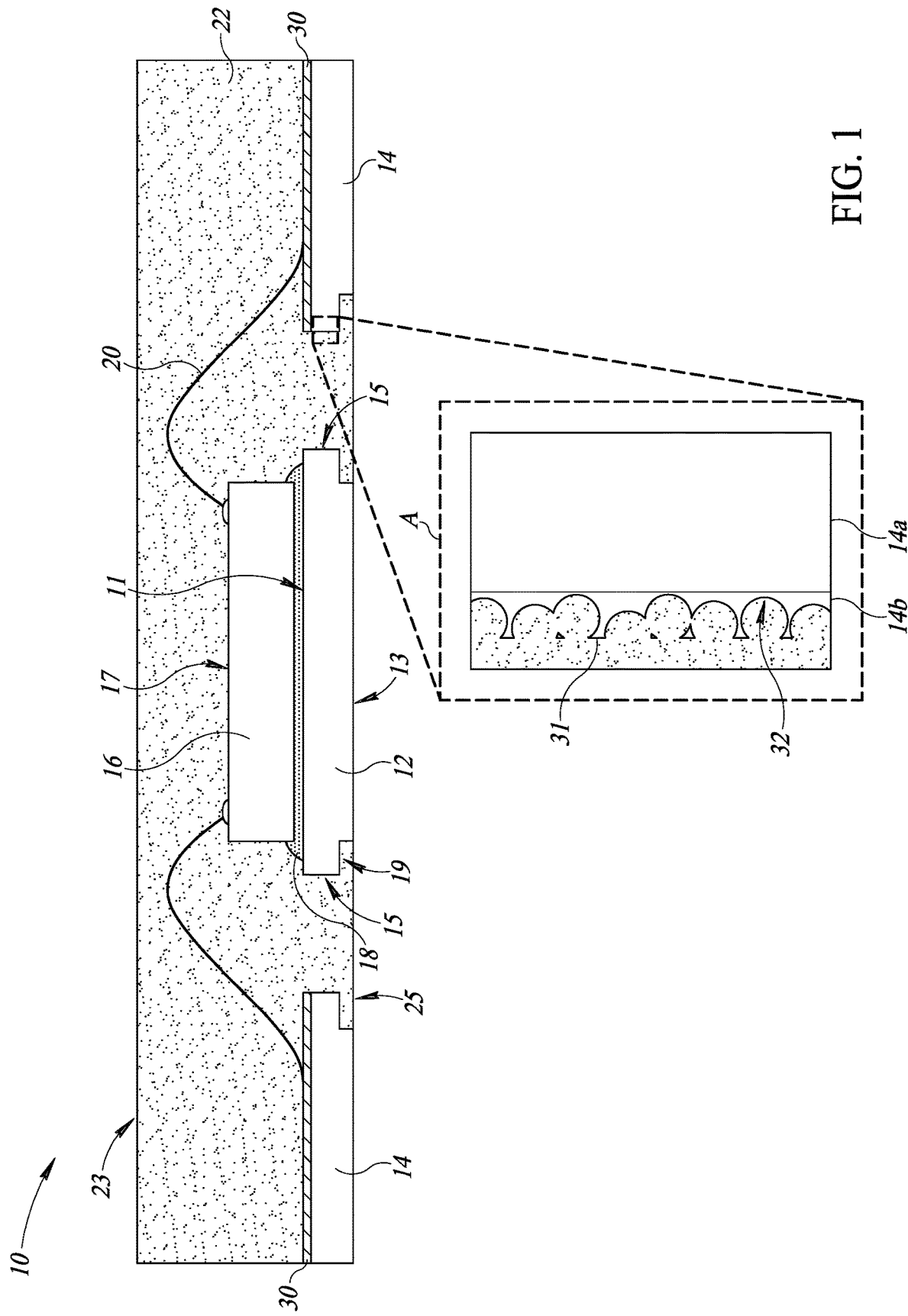
FIG. 1 is a cross-sectional view of a semiconductor package, in accordance with one or more embodiments of the present disclosure.

FIG. 1 is a cross-sectional view illustrating a semiconductor package 10 in accordance with one or more embodiments of the present disclosure. In some embodiments, the package 10 may be a QFN semiconductor package, as shown, however embodiments of the present disclosure are not limited thereto. In some embodiments, the package 10 may be a QFN multi-row (QFN-mr) package having a plurality of rows of exposed leads or lead pads.

The package 10 includes a die pad 12 and a plurality of leads 14 that are spaced apart from the die pad 12 in a lateral direction (e.g., in the horizontal direction as shown in FIG. 1). The package 10 may include an array of leads 14 around the die pad 12.

A semiconductor die 16 is positioned on the die pad 12. The semiconductor die 16 may be any semiconductor die including one or more electrical components, such as integrated circuits. The semiconductor die 16 is made from a semiconductor material, such as silicon, and includes an active surface 17 in which integrated circuits are formed. The integrated circuits may be analog or digital circuits implemented as active devices, passive devices, conductive layers, and dielectric layers formed within the semiconductor die 16 and electrically interconnected according to the electrical design and function of the semiconductor die 16.

In some embodiments, the semiconductor die 16 is secured to an inner surface of the die pad 12 by an adhesive material 18. The adhesive material 18 may be any material suitable to mechanically and/or electrically couple the semiconductor die 16 to the die pad 12, such as conductive glue, paste, tape, or the like. In one or more embodiments, the adhesive material 18 may be a die attach film suitable to attach the semiconductor die 16 to the die pad 12.

The semiconductor die 16 is secured to the die pad 12 with the active surface 17 of the semiconductor die 16 facing away from the inner surface of the die pad 12, as shown in FIG. 1.

Conductive wires 20 electrically couple the semiconductor die 16 to the leads 14. For example, the conductive wires 20 may electrically couple respective bond pads on the active surface 17 of the semiconductor die 16 to respective leads 14, and the conductive wires 20 may extend between the active surface 17 of the semiconductor die 16 and inner surfaces of the leads 14.

A layer of encapsulation material 22 is formed over the semiconductor die 16, and covers the semiconductor die 16 and the conductive wires 20. The encapsulation material 22 has a first surface 23 (e.g., an upper surface as shown in FIG. 1) and a second surface 25 (e.g., a lower surface as shown in FIG. 1) that is opposite the first surface 23. The second surface 25 extends between the die pad 12 and the leads 14. The first surface 23 and the second surface 25 may be exposed surfaces which form parts of an exterior of the semiconductor package 10.

The die pad 12 and the leads 14 may be formed of a same material. For example, the die pad 12 and the leads 14 may be provided as part of a same lead frame, which in some embodiments may be a QFN lead frame. In some embodiments, the die pad 12 and the leads 14 may be formed of copper, such as a copper lead frame.

The die pad 12 and the leads 14 have a plurality of surfaces, and a plurality of cavities 32 may extend into the die pad 12 or the leads 14 from at least one of the plurality of surfaces. For example, as shown in the enlarged view of a region A in FIG. 1, the leads 14 may include a plurality of cavities 32 which extend into leads 14 from a side surface 31. Inner surfaces of the cavities 32 may be rounded, as shown, which may increase a surface area of the cavities 32, thereby promoting increased contact and adhesion with the encapsulant material 22. In some embodiments, the cavities 32 may be semi-spherical shaped cavities. However, embodiments of the present disclosure are not limited thereto, and in various embodiments, the cavities 32 may have various other shapes.

The lead frame, which may include both the die pad 12 and the leads 14, may have a multilayer structure. For example, as shown in the region A, the lead 14 may include a first layer 14a and a second layer 14b that is disposed on the first layer 14a. The first and second layers 14a, 14b may be formed of a same material, e.g., copper. For example, the second layer 14b may be a layer of copper that is deposited on the first layer 14a, which also may be copper.

As will be discussed in further detail herein with respect to FIGS. 2A to 2C, the cavities 32 may be formed by inclusion of microstructures (such as microbeads, or the like) during deposition of the second layer 14b. The microstructures are subsequently removed (e.g., by dissolution), leaving behind the cavities 32 in the second layer 14b. The cavities 32 may therefore have various different sizes and shapes, depending on the size and shape of the microstructures.

In some embodiments, the second layer 14b may have a thickness within a range from 0.5 µm to 10 µm, inclusive. In some embodiments, the second layer 14b may have a thickness within a range from 1 µm to 5 µm, inclusive, and in some embodiments, the second layer 14b may have a thickness within a range from 1 µm to 2 µm, inclusive. The cavities 32 may have a width (e.g., extending into the second layer 14b) that is less than the thickness of the second layer 14b, so that the cavities 32 do not extend into the first layer 14a. In some embodiments, the cavities 32 may have a width that is within a range from 0.5 µm to 5 µm, inclusive, and in some embodiments, the width of the cavities 32 is within a range from 0.5 µm to 2 µm, inclusive. That is, the cavities 32 may extend into the second layer 14b to a depth that is within a range from 0.5 µm to 5 µm in some embodiments, and may extend to a depth that is within a range from 0.5 µm to 2 µm in some embodiments. In embodiments in which the cavities 32 are spherical or semi-spherical in shape, the cavities 32 may have a radius that is within a range from 0.25 µm to 1 µm, inclusive.

While the enlarged region A is shown as being a region at a side surface of the lead 14, it will be readily appreciated that the same structure may be provided at any of the surfaces of the die pad 12 or the leads 14. For example, one or more surfaces of the die pad 12 may include first and second layers of lead frame material (e.g., copper layers), and cavities 32 may extend into the second layer of the material due to inclusion of microstructures during formation of the second layer, which microstructures are subsequently removed to leave the cavities. In various embodiments, some or all of the surfaces of the die pad 12 and the leads 14 may be exposed during formation of cavities 32 and may include the cavities 32.

As shown in the enlarged region A of FIG. 1, the encapsulant material 22 substantially fills the cavities 32. For example, the encapsulant material 22 may contact the lead 14 (e.g., the second layer 14b) within the cavities 32. Additionally, the encapsulant material 22 may contact the surface 31 of the lead 14. By filling the cavities 32, as well as contacting the lead 14 at the surface 31, adhesion between the encapsulant material 22 and the leads 14 is improved. More particularly, mechanical interlock is provided at the interface between the leads 14 (or the die pad 12) and the encapsulant material 22 and the surface area is increased for increased interfacial interaction between the leads 14 or die pad 12 and the encapsulant material 22.

In some embodiments, one or more of an upper surface 11 of the die pad 12 (e.g., a surface of the die pad 12 that faces the semiconductor die 16), a lower surface 13 of the die pad 12 (e.g., an exposed surface of the die pad 12), and side surfaces 15 of the die pad 12 may include a plurality of cavities 32.

In some embodiments, the die pad 12 may include recessed portions 19 which may include cavities 32 at the surface thereof. For example, the recessed portions 19 may be formed as recesses which extend into the die pad 12 from the lower surface 13 of the die pad 12 at side edges of the die pad 12. The recessed portions 19 further increase a surface area of contact between the die pad 12 and the encapsulant material 22, thereby increasing the adhesion of the encapsulant material 22 to the die pad 12.

As shown in FIG. 1, the leads 14 may similarly include recessed portions which are substantially similar to the recessed portions 19 of the die pad 12 and which increase adhesion between the encapsulant material 22 and the leads 14.

In some embodiments, the second surface 25 of the encapsulation material 22 is an exposed surface which forms a part of an exterior (e.g., part of the bottom surface) of the package 10 along with outer surfaces of the die pad 12 (e.g., the lower surface 13 of the die pad 12) and the leads 14 (e.g., lower and outer side surfaces of the leads 14). The encapsulation material 22 may substantially fill any spaces or gaps between the various components in the package 10. As shown in FIG. 1, in some embodiments, the encapsulation material 22 is formed on inner surfaces of the die pad 12 and the leads 14. The encapsulation material 22 may thus fill or substantially fill the cavities 32 formed at any of the various surfaces of the die pad 12 and the leads 14.

The encapsulation material 22 is an electrically insulating material that protects the semiconductor die 16, conductive wires 20, and any other electrical components or wiring from damage, such as corrosion, physical damage, moisture damage, or other causes of damage to electrical devices and materials. Additionally, the encapsulation material 22 provides structural support to the die pad 12 and the leads 14. In one or more embodiments, the encapsulation material 22 is a molding compound or an epoxy mold compound, which may include, for example, a polymer resin.

The exposed bottom or outer surfaces of the leads 14, which may be referred to as lands of the package 10, as well as the exposed lower surface 13 of the die pad 12, are configured to electrically or mechanically couple the package 10 to external circuitry or to another device or board, such as to an external printed circuit board.

In some embodiments, a plated conductive layer 30 may be formed on one or more surfaces of the lead 14. For example, the plated conductive layer 30 may be formed on upper surfaces of the lead 14, to which the conductive wires 20 are bonded. The plated conductive layer 30 may be resistant to the formation of copper (e.g., when the second layer of material is formed including the microstructures which result in the cavities 32), and thus, the plated conductive layer 30 may remain substantially smooth and free of cavities, thereby providing a suitable conductive surface for bonding with the conductive wires 20.

The plated conductive layer 30 may include any electrically conductive material. In some embodiments, the plated conductive layer 30 includes a plurality of metal layers. In some embodiments, the plated conductive layer 30 is a multilayer structure including a first layer of nickel (Ni), a second layer of palladium (Pd), and a third layer of gold (Au).

The plated conductive layer 30 may be substantially thinner than the leads 14. In some embodiments, the plated conductive layer 30 may have a thickness less than about 50 µm.

Figure 2A:
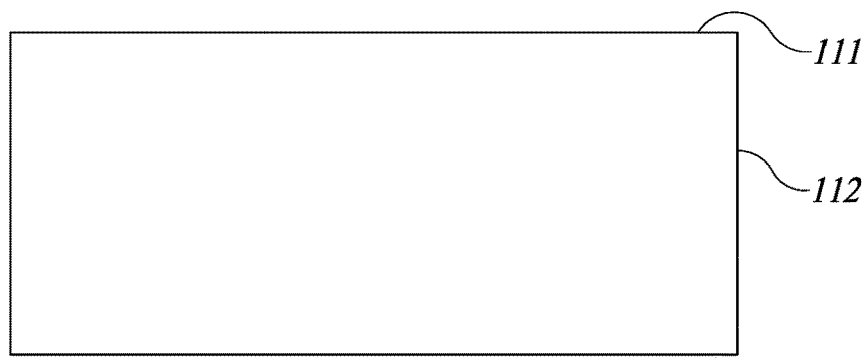
FIGS. 2A to 2C are cross-sectional views showing various stages of a method of forming cavities in a substrate, in accordance with one or more embodiments of the present disclosure.
Figure 2B:
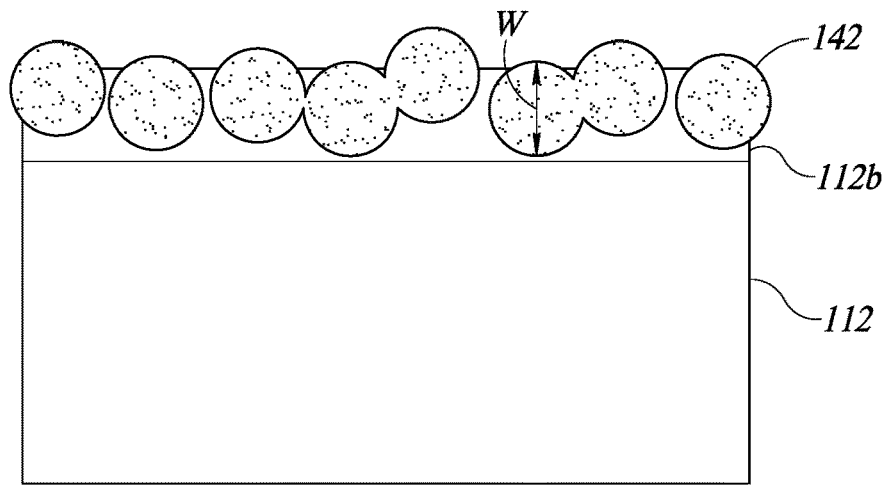
Figure 2C:
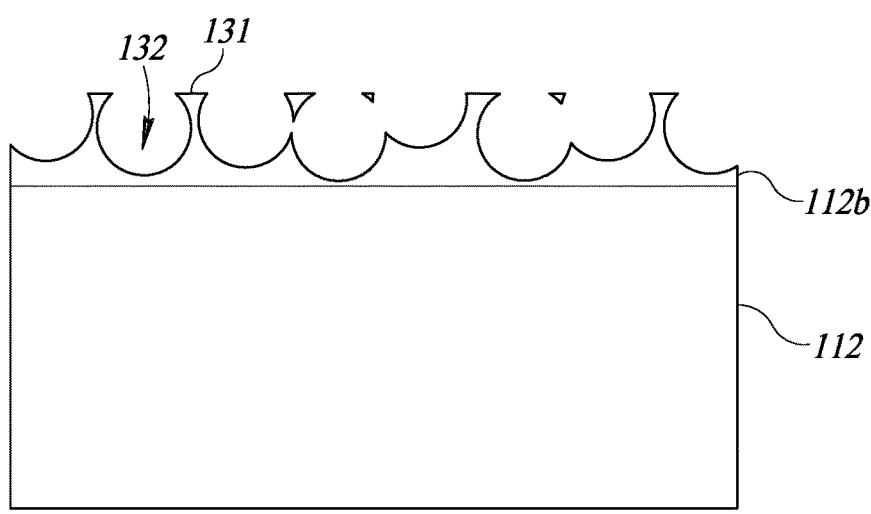

FIGS. 2A to 2C are cross-sectional views showing various stages of a method of forming cavities in a substrate, such as a copper lead frame or a copper substrate, in accordance with one or more embodiments. The method of forming cavities may be referred to herein as an immersion porous copper adhesion promoter (IPC-AP) process.

As shown in FIG. 2A, a substrate 112 is provided. The substrate 112 may be, for example, a copper lead frame which forms the die pad 12 and the leads 14 of the semiconductor package 10 illustrated in FIG. 1. The substrate 112 may have a substantially planar surface 111, for example, at an upper surface as shown in FIG. 2A. In some embodiments, the method includes pre-treating the substrate 112 to provide the clean, substantially planar surface 111. The pre-treatment may include, for example, degreasing of the substrate 112 to remove organic surface contaminants or the like. The pre-treatment may further include removal of oxides at the surface 111, for example, by microetching or the like.

As shown in FIG. 2B, a conductive layer 112b is formed on the substrate 112. The conductive layer 112b may be formed of a same material as the substrate 112. For example, the conductive layer 112b may be a copper layer that is formed on the copper substrate 112. In some embodiments, the conductive layer 112b may be formed by an electroless or autocatalytic copper deposition or plating process in which the copper substrate 112 is immersed in a copper bath which forms a plating or a thin layer of the conductive layer 112b on the substrate 112. In various embodiments, the conductive layer 112b may have a thickness within a range from 0.5 µm to 10 µm, inclusive, a thickness within a range from 1 µm to 5 µm, inclusive, or a thickness within a range from 1 µm to 2 µm, inclusive.

As shown in FIG. 2B, a plurality of microstructures 142 are formed concurrently with the formation of the conductive layer 112b, so that the microstructures 142 are at least partially embedded in the conductive layer 112b. The microstructures 142 may be any soluble microstructures which can be removed by exposure to a suitable solvent. In some embodiments, the microstructures 142 may be polymer microbeads. In some embodiments, the microstructures 142 may be microbeads formed of or including at least one of polystyrene or polydimethylsiloxane.

The microstructures 142 may have any shape. In some embodiments, the microstructures 142 may have at least partially rounded exterior portions, so that the cavities are formed to have at least partially rounded shapes. In some embodiments, the microstructures 142 may be semi-spherical shaped microstructures.

The microstructures 142 may have a width W that is less than the thickness of the conductive layer 112b, and the microstructures 142 may be spaced apart from the substrate 112 (e.g., the microstructures 142 do not extend into the substrate 112). In some embodiments, the microstructures 142 may have a width W that is within a range from 0.5 μm to 2 μm, inclusive. In embodiments in which the microstructures 142 are spherical or semi-spherical in shape, the microstructures 142 may have a radius that is within a range from 0.25 μm to 1 μm, inclusive.

In various embodiments, the sizes and shapes of the microstructures 142 may be different from one another, depending, for example, on a desired size and shape of resulting cavities to be formed in the lead frame (e.g., the die pad 12 or leads 14).

As previously noted, the conductive layer 112b and the microstructures 142 may be concurrently formed or plated on the substrate 112 by an electroless copper deposition or plating process. In some embodiments, the electroless copper deposition or plating process includes immersing the substrate 112 (e.g., a copper substrate) in a plating bath that includes copper ions (e.g., $Cu^{2+}$) and the microstructures 142. The microstructures 142 may be an active component of the chemistry in the plating bath, for example, by bonds which may form between the microstructures 142 and one or more components of the plating bath. In some embodiments, the plating bath may include copper ions (e.g., $Cu^{2+}$), the microstructures 142, and one or more of a reducing agent, an additive, and a complexant. In such embodiments, the microstructures 142 may be selected to bond with the reducing agent, the additive, or the complexant. Accordingly, the microstructures 142 may become an active component of the plating bath and may be included as part of the growth or deposition of the conductive layer 112b.

The electroless copper deposition or plating process may implement or facilitate an autocatalytic reaction of the $Cu^{2+}$ ions in the plating bath with the exposed copper surface of the substrate 112, thus affecting only the exposed copper surfaces. Accordingly, in various embodiments, an entire lead frame (e.g., including the die pad 12 and the leads 14 shown in FIG. 1) may be immersed in the plating bath, and only exposed copper portions of the lead frame may be reacted with the plating bath in order to grow or deposit the conductive layer 112b thereon, while non-exposed surfaces (such as surfaces of the leads 14 covered by the plated conductive layer 30) may be protected from reaction and thus cavities may not form on the non-exposed surfaces. In this way, the bonding surfaces (e.g., the plated conductive layer 30 on the leads 14) may not be affected by the IPC-AP process, thereby retaining a substantially smooth surface suitable for wire bonding.

As shown in FIG. 2B, portions of the microstructures 142 may extend outwardly beyond an upper surface of the conductive layer 112b. This facilitates exposure of the microstructures 142 with a solvent in order to remove the microstructures 142 and form the cavities, as will be discussed in further detail with respect to FIG. 2C.

As shown in FIG. 2C, cavities 132 are formed in the conductive layer 112b by removing the microstructures 142.

In some embodiments, the microstructures 142 are removed by exposure to a suitable solvent. The solvent may be any solvent which is capable of dissolving the microstructures 142, which may be formed of any soluble material. In some embodiments, the solvent includes one or more of acetone, diethyl ether, or dioxane.

The solvent may be applied to the microstructures 142 by any suitable technique, including, for example, immersion of the conductive layer 112b and microstructures 142 in a solvent bath, spraying or otherwise introducing the solvent to an upper surface of the structure shown in FIG. 2B (e.g., onto the exposed portions of the microstructures 142 and to upper surfaces of the conductive layer 112b), or any other suitable technique. In some embodiments, the entire structure shown in FIG. 2B (e.g., including the substrate 112, the conductive layer 112b, and the microstructures 142) may be immersed in a bath of the solvent in order to remove the microstructures 142.

After removal of the microstructures 142, the cavities 132 are formed and extend into the substrate (e.g., into the conductive layer 112b of the substrate 112) from a surface 131 of the substrate. The cavities 132 provide increased surface area for bonding with an encapsulant material 22, and the rounded or semi-spherical shape of the cavities 132 provide for increased mechanical interlock with the encapsulant material 22.

FIGS. 3A-3E are cross-sectional views showing various stages of a method of manufacturing semiconductor packages, such as the semiconductor package 10 of FIG. 1, in accordance with one or more embodiments.

Figure 3A:
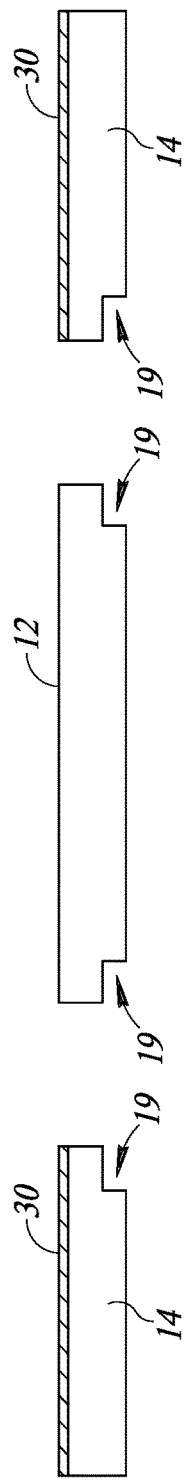
FIGS. 3A-3E are cross-sectional views showing various stages of a method of manufacturing semiconductor packages, such as the semiconductor package of FIG. 1, in accordance with one or more embodiments of the present disclosure.

As shown in FIG. 3A, a substrate or a lead frame is provided that includes a die pad 12 and a plurality of leads 14. A plated conductive layer 30 may be formed on surfaces (e.g., upper surfaces) of each of the leads 14. A plurality of cavities 32 (see FIG. 1) is formed in exposed surfaces of the die pad 12 or the leads 14. The cavities may be formed at any of the exposed surfaces of the die pad 12 or the lead 14, i.e., at any of the upper, lower, or side surfaces of the die pad 12 and at any of the lower or side surfaces of the leads 14. The upper surfaces of the leads 14 may be protected from formation of cavities due to the presence of the plated conductive layer 30.

The cavities may be substantially the same as the cavities 32 described with respect to FIG. 1 or the cavities 132 described with respect to FIG. 2C.

The substrate (e.g., which forms the die pad 12 and the leads 14) may be any suitable substrate in which the cavities may be formed. In some embodiments, the substrate is a metal substrate, such as a lead frame. In some embodiments, the substrate is a copper substrate.

The plurality of cavities may be formed by any suitable techniques, including, for example, according to the method of forming cavities described herein with respect to FIGS. 2A to 2C. For example, the cavities may be formed by immersing the exposed surfaces of the die pad 12 and the leads 14 in an electroless copper deposition or plating bath which includes microstructures 142. The microstructures 142 may thus be embedded in a conductive layer 112b, and the microstructures 142 may subsequently be removed by a solvent leaving behind the cavities 132, for example, as described with respect to FIG. 2A to 2C.

In some embodiments, the die pad 12 or the leads 14 may include recessed portions 19 which may be exposed surfaces in which the cavities may be formed. For example, the recessed portions 19 may be formed as recesses which extend into the die pad 12 or the leads 14 from lower surfaces of the die pad 12 or the leads 14. The recessed portions 19 further increase a surface area of contact between the die pad 12 or the leads 14 and the encapsulant material 22 (which is later formed), thereby increasing the adhesion of the encapsulant material 22 to the die pad 12 or the leads 14.

The plated conductive layer 30 on the leads 14 may include any electrically conductive material. In some embodiments, the plated conductive layer 30 is formed of an electrically conductive material that is resistant to the chemistry in the electroless copper deposition or plating bath, so that cavities are not formed in the plated conductive layer 30.

In some embodiments, the plated conductive layer 30 is a multilayer structure including a first layer of nickel (Ni), a second layer of palladium (Pd), and a third layer of gold (Au). The plated conductive layer 30 may be formed by any suitable technique, including, for example, deposition, electroplating, or the like.

Figure 3B:
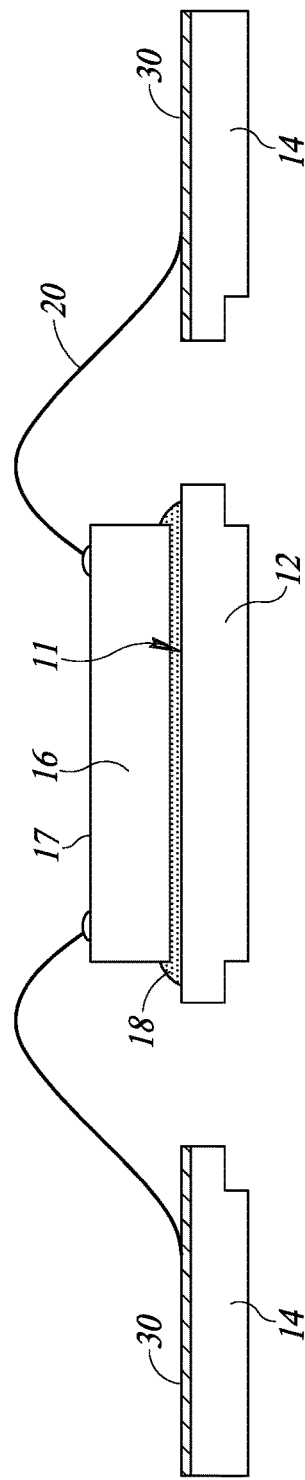

As shown in FIG. 3B, a semiconductor die 16 is attached to the die pad 12, and wire bonds or conductive wires 20 are formed between an active surface 17 of the semiconductor die 16 and the plated conductive layer 30 on the leads 14.

The semiconductor die 16 may be attached to a surface 11 (e.g. upper surface) of the die pad 12 by an adhesive material 18. The adhesive material 18 may be any material suitable to mechanically and/or electrically couple the semiconductor die 16 to the die pad 12, such as conductive glue, paste, tape, or the like. In one or more embodiments, the adhesive material 18 is a die attach film suitable to attach the semiconductor die 16 to the die pad 12.

In some embodiments, the surface 11 of the die pad 12 includes cavities formed, for example, by the method illustrated in FIGS. 2A to 2C. That is, a plurality of cavities may extend into the die pad 12 from the surface 11. In such embodiments, the adhesive material 18 may extend into, and may be substantially fill, the cavities in the surface 11 of the die pad 12, thereby promoting improved adhesion between the die pad 12 and the adhesive material 18, which also improves adhesion between the die pad 12 and the semiconductor die 16.

The conductive wires 20 may be formed, for example by wire bonding, and the conductive wires 20 electrically couple bond pads on the active surface 17 of the semiconductor die 16 to the leads 14.

Figure 3C:
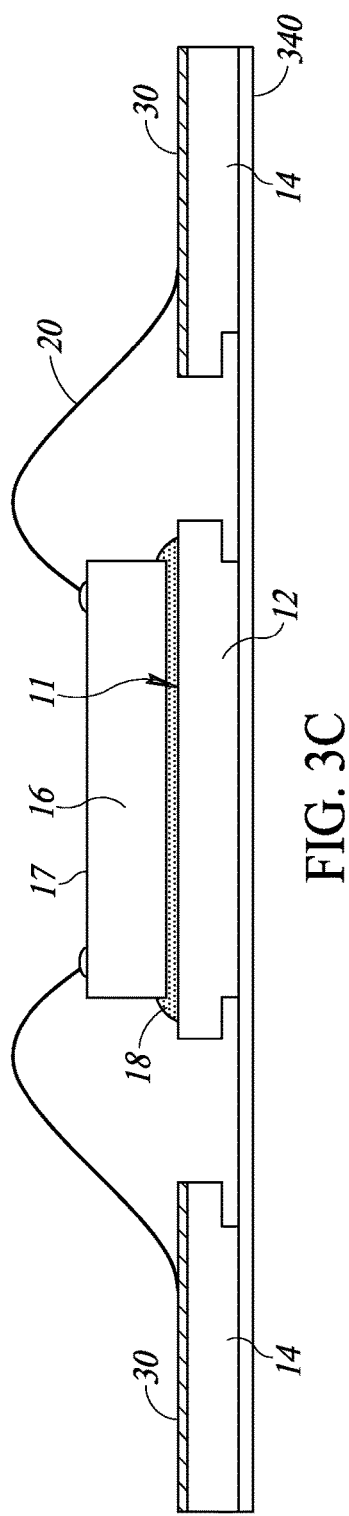

As shown in FIG. 3C, a carrier tape 340 may be applied to the assembly of FIG. 3B (e.g., including the die pad 12, leads 14, semiconductor die 16, and conductive wires 20). More particularly, the carrier tape 340 may be applied to lower surfaces of the die pad 12 and the leads 14. The carrier tape 340 facilitates transport of the assembly, for example, to a mold cavity for forming the encapsulant 22. In some embodiments, the carrier tape 340 may be omitted.

Figure 3D:
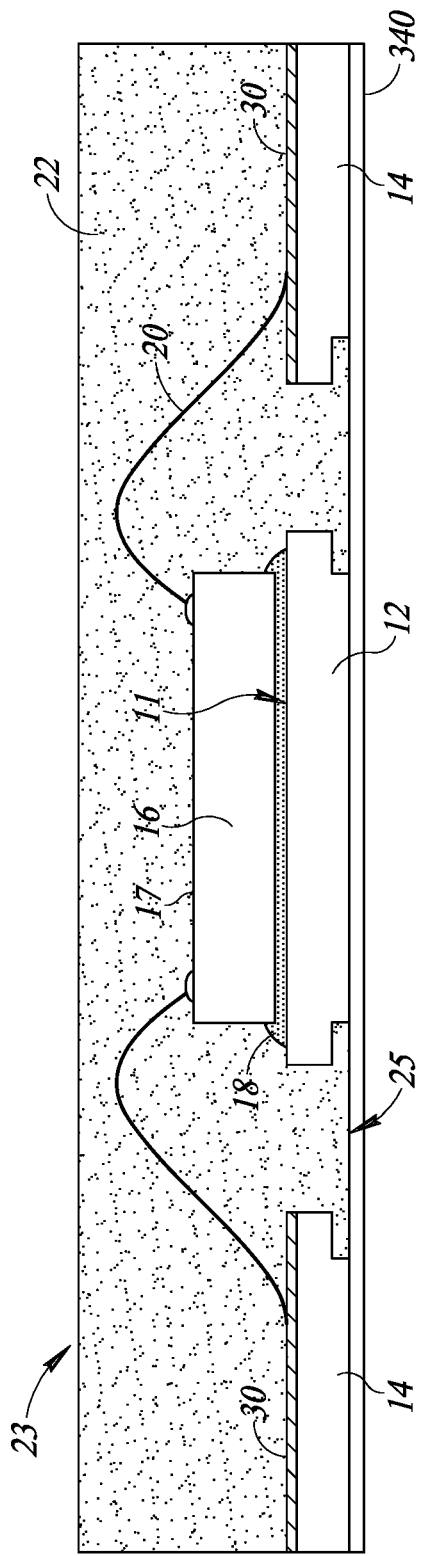

As shown in FIG. 3D, the encapsulation material 22 is formed over the semiconductor die 16, and covers the semiconductor die 16 and the conductive wires 20. The encapsulation material 22 further covers the plated conductive layer 30, portions of the surface 11 of the die pad 12, as well as exposed side surfaces of the die pad 12 and the leads 14. The encapsulation material 22 may further fill the recessed portions 19 of the die pad 12 and the leads 14. The encapsulation material 22 substantially fills the plurality of cavities which are formed in surfaces of the die pad 12 or the leads 14, as shown, for example, in the enlarged region A of FIG. 1. Accordingly, improved adhesion and mechanical interlock is provided between the surfaces of the die pad 12 or the leads 14 and the encapsulation material 22.

The encapsulation material 22 has a first surface 23 and a second surface 25 that is opposite the first surface 23. The second surface 25 extends between the die pad 12 and the leads 14. The first surface 23 and the second surface 25 may be exposed surfaces which form parts of an exterior of the semiconductor package 10.

The encapsulation material 22 may be formed by any conventional techniques, such as by a molding process. For example, the molding process may include positioning the assembly shown in FIG. 3C (e.g., including the die pad 12, leads 14, semiconductor die 16, and conductive wires 20) into a mold and injecting a molding material, such as a molding compound, an epoxy mold compound, a polymer resin, or the like. The injected material is then hardened, which may involve a curing step.

Figure 3E:
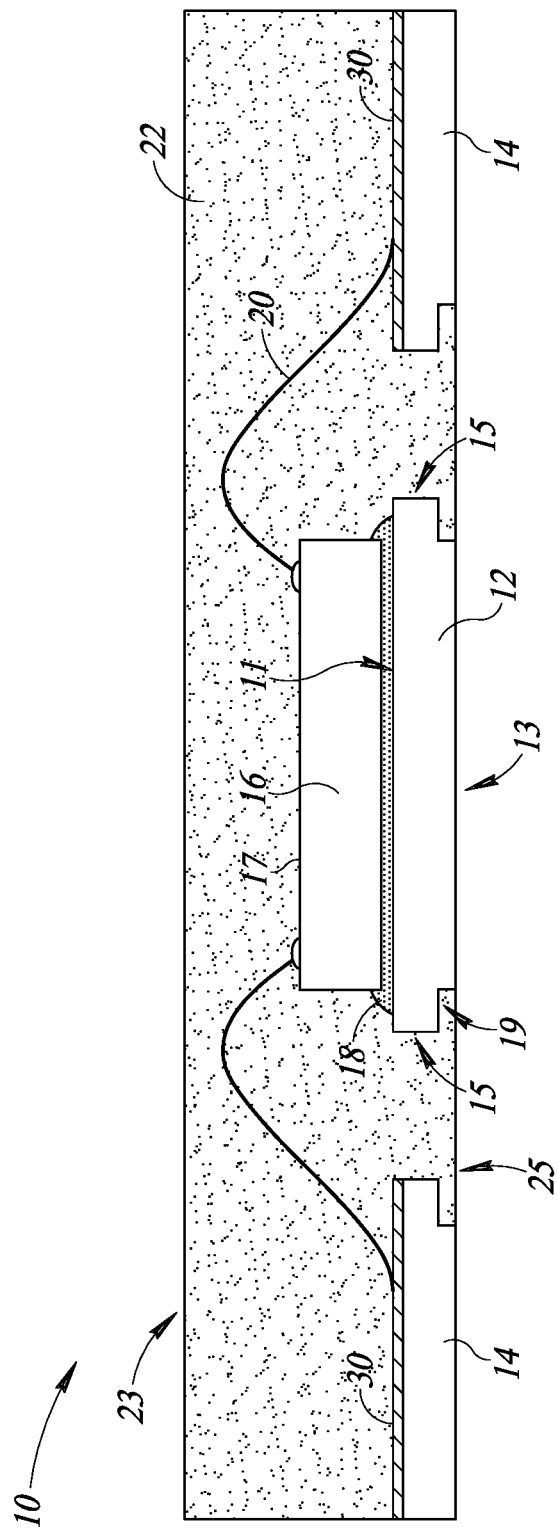

As shown in FIG. 3E, the carrier tape 340 is removed after the encapsulation material 22 is formed. The carrier tape 340 may be removed by any suitable technique, including by mechanical separation, cutting, etching, or the like.

This encapsulation material 22 provides suitable structural support to the die pad 12 and the leads 14 so that the die pad 12 and the leads 14 may generally retain their shape and structure after the carrier tape 340 has been removed.

The completed semiconductor package 10 is formed after the carrier tape 340 has been removed, as shown in FIG. 3E. By removing the carrier tape 340, outer surfaces of the die pad 12 and the leads 14 are exposed, and the die pad 12 and leads 14, as well as the second surface 25 of the encapsulation material 22, form exterior surfaces of the semiconductor package 10. The exposed outer surfaces of the leads 14 and the die pad 12 may be electrically and/or mechanically coupled, for example, to another device or board, such as a printed circuit board.

Figure 4:
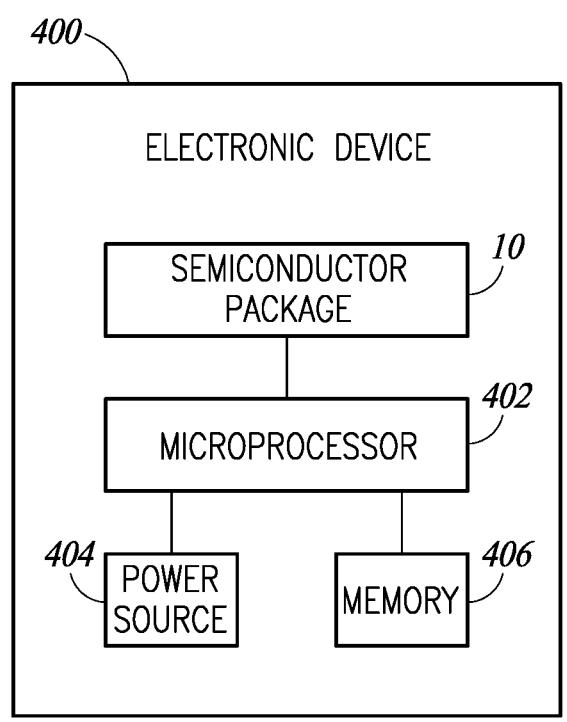
FIG. 4 is a block diagram illustrating an electronic device including a semiconductor package, in accordance with one or more embodiments of the present disclosure.

FIG. 4 shows an electronic device 400 including a semiconductor package described herein, such as the semiconductor package 10. The semiconductor package 10 is electrically coupled to a microprocessor 402. The microprocessor 402 may be any circuit configured to receive or send electrical signals to the semiconductor package 10. The electronic device 400 may further include a power source 404 configured to provide electric power for the device 400. The power source 404, which may be a battery, may be coupled to the microprocessor 402. The electric device 400 may also include a memory 406 coupled to or incorporated in the microprocessor 402.

In one or more embodiments, the electronic device 400 may be a cell phone, smartphone, tablet, camera, and/or wearable computing device that may be located in clothing, shoes, watches, glasses or any other wearable structures. In some embodiments, the electronic device 400, or the semiconductor package 10 itself, may be located in a vehicle, such as boat and car, a robot, or any other moveable structure or machinery.

As has been described with respect to various embodiments of semiconductor devices, packages, and methods provided herein, one or more surfaces of a substrate (e.g., a copper lead frame) are processed to improve adhesion between the substrate and an encapsulant material, such as a mold compound or an epoxy mold compound. An electroless copper deposition or plating process is performed on the substrate, in which microstructures such as microbeads are embedded in a deposited or plated copper layer formed on a surface of the substrate. The microbeads may be soluble, and may be removed by any solvent, thereby leaving behind a roughened surface in the copper layer. The roughened surface is a surface in which a plurality of cavities are formed and which extend into the substrate from a surface thereof. The roughened surface (e.g., the plurality of cavities) promotes better adhesion with the mold compound, which reduces or prevents delamination between the mold compound and the substrate (e.g., the die pad or the leads).

The increased adhesion between the mold compound and the die pad or leads provided by various embodiments of the present disclosure is advantageous over other potential methodologies to increase adhesion. For example, introduction of an oxide layer to the die pad or leads may be employed to increase adhesion, since the functional groups in the mold compound may have preferential interaction with an oxide as compared with unoxidized copper. However, copper oxides (e.g., $Cu_2O$) may be metastable oxides having a tendency to further oxidize (e.g., forming CuO), which is a brittle material susceptible to fracture. This may result in delamination between the mold compound and the die pad or the leads. On the other hand, solutions provided by the present disclosure (e.g., forming cavities in which the mold compound is filled) avoid such formation of oxides and thereby avoid delamination.

Moreover, embodiments provided herein provide the increased adhesion between the mold compound and the die pad and leads without mechanically roughening surfaces of the die pads and leads. Mechanical roughening, for example, may disadvantageously result in roughened surfaces of the leads which are bonded by the wire bonds. On the other hand, embodiments of the present disclosure facilitate formation of the cavities by chemical processes, and the bonding surface of the leads (e.g., the plated conductive layer) may be resistant to formation of cavities so that wire bonding problems are avoided. That is, the substantially smooth bonding surface of the leads may be retained after other surfaces of the die pad or leads are roughened (e.g., cavities are formed therein) for increased adhesion with the encapsulation material.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    forming a semiconductor device by:
        forming a conductive layer on a conductive substrate, the conductive layer including a plurality of microstructures at least partially embedded in the conductive layer;
        forming a plurality of cavities in the conductive layer by removing the plurality of microstructures; and
        at least partially filling the plurality of cavities with an encapsulation material.

2. The method of claim 1 wherein the conductive substrate is a copper substrate, and the forming the conductive layer includes forming a copper layer on the copper substrate by electroless deposition.

3. The method of claim 1 wherein the removing the plurality of microstructures includes dissolving the microstructures in a solvent.

4. The method of claim 1 wherein the microstructures include at least one of polystyrene or polydimethylsiloxane, and the solvent includes at least one of acetone, diethyl ether, or dioxane.

5. The method of claim 1 wherein the forming the conductive layer includes forming the conductive layer to have a thickness within a range from 0.5 µm to 10 µm, inclusive, and the cavities have a width that is less than the thickness of the conductive layer.

6. The method of claim 1 wherein each of the plurality of microstructures has a semi-spherical shape.

7. The method of claim 1, further comprising:
    attaching a semiconductor die to a die pad portion of the conductive substrate;
    forming wire bonds between an active surface of the semiconductor die and a lead portion of the conductive substrate, the lead portion spaced laterally apart from the die pad portion; and
    forming the encapsulation material over the active surface of the semiconductor die, the wire bonds, the die pad portion of the conductive substrate, and the lead portion of the conductive substrate.

8. A method, comprising:
    forming a package by:
        forming a first conductive layer on a first surface of a first lead by forming a conductive material having a plurality of microstructures, the first lead includes a second surface transverse to the first surface, the first surface being an internal surface of the package;
        forming a plurality of cavities in the first conductive layer by removing the plurality of microstructures;
        forming a second conductive layer on the second surface of the first lead, the second conductive layer being smoother than the first conductive layer; and
        forming an encapsulant on the first surface and in the plurality of cavities.

9. The method of claim 8 wherein the first conductive layer is more rough than the second conductive layer.

10. The method of claim 9 wherein the second conductive layer is free from cavities.

11. The method of claim 10 wherein forming the plurality of cavities includes forming cavities that includes a first cavity that is a different size than a second cavity.

12. The method of claim 11 wherein the plurality of cavities are semi-spherical.

13. The method of claim 8 wherein the conductive material is copper.

14. The method of claim 8 wherein the removing the plurality of microstructures includes dissolving the plurality of microstructures in a solvent.

15. The method of claim 14 wherein the solvent includes at least one of acetone, diethyl ether, or dioxane.

16. The method of claim 8 where the plurality of microstructures includes at one least one of polystyrene or polydimethylsiloxane.

17. A method, comprising:
    forming a package including a die pad by:
        forming a first lead that includes a first internal surface and a second internal surface that is transverse to the first internal surface, the first internal surface including a first plurality of cavities;
        forming a second lead that includes a third internal surface and a fourth internal surface that is transverse to the third internal surface, the first internal surface facing the third internal surface, the third internal surface including a second plurality of cavities, the die pad of the package being between the first and third internal surfaces; and forming an encapsulant on the first, second, third, and fourth internal surfaces, the encapsulant being in the first plurality of cavities on the first internal surface and the second plurality of cavities on the third internal surface of the second lead.

18. The method of claim 17 comprising forming the second internal surface to be smoother than the first internal surface and the fourth internal surface to be smoother than the third internal surface.

19. The method of claim 17 comprising forming the first internal surface as part of a first conductive layer and the second internal surface as part of a second conductive layer, the second conductive layer is smoother than the first conductive layer.

20. The method of claim 17 wherein the first and second plurality of cavities are semi-spherical.

* * * * *